(12) United States Patent
Lee et al.

(10) Patent No.: US 7,677,707 B2
(45) Date of Patent: Mar. 16, 2010

(54) METHOD OF FORMING THICK LAYER BY SCREEN PRINTING AND METHOD OF FORMING PIEZOELECTRIC ACTUATOR OF INKJET HEAD

(75) Inventors: Kyo-yeol Lee, Yongin-si (KR); Tae-kyun Lee, Suwon-si (KR); Jae-woo Chung, Yongin-si (KR); Hwa-sun Lee, Suwon-si (KR); Seung-mo Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 550 days.

(21) Appl. No.: 11/581,334

(22) Filed: Oct. 17, 2006

(65) Prior Publication Data

US 2007/0195132 A1    Aug. 23, 2007

(30) Foreign Application Priority Data

Feb. 17, 2006    (KR) ...................... 10-2006-0015628

(51) Int. Cl.
   *B41J 2/045*    (2006.01)
(52) U.S. Cl. ...................................................... 347/70
(58) Field of Classification Search .................. 347/70, 347/68–69, 71–72
   See application file for complete search history.

(56) References Cited

U.S. PATENT DOCUMENTS 7,387,372 B2 *    6/2008    Ishikawa et al. .............. 347/68

7,537,320 B2 *    5/2009    Sugahara ...................... 347/70

FOREIGN PATENT DOCUMENTS

| CN | 1611361 | 5/2005 |
|---|---|---|
| CN | 1721182 | 1/2006 |
| EP | 1598191 | 11/2005 |

OTHER PUBLICATIONS

Chinese Office Action dated Sep. 18, 2009 issued in CN Application No. 200610143324.6.

* cited by examiner

*Primary Examiner*—K. Feggins
(74) *Attorney, Agent, or Firm*—Stanzione & Kim LLP

(57) ABSTRACT

A method to form a thick layer by screen printing and a method to form a piezoelectric actuator of an inkjet head. The method to form the thick layer including forming a guide groove in a surface to a predetermined depth, and forming the thick layer by applying a material to the surface inside the guide groove through screen printing. The method to form the piezoelectric actuator including forming an insulating layer on a top surface of a vibration plate and forming a guide groove in the top surface of the vibration plate or an insulating layer to a predetermined depth at a position corresponding to each of a plurality of pressure chambers, forming a lower electrode on the top surface of the insulating layer; forming a piezoelectric layer inside the guide groove by screen printing, and forming an upper electrode on a top surface of the piezoelectric layer.

5 Claims, 5 Drawing Sheets

METHOD OF FORMING THICK LAYER BY SCREEN PRINTING AND METHOD OF FORMING PIEZOELECTRIC ACTUATOR OF INKJET HEAD

CROSS-REFERENCE TO RELATED APPLICATIONS

This application claims priority under 35 U.S.C. §119(a) from Korean Patent Application No. 10-2006-0015628, filed on Feb. 17, 2006, in the Korean Intellectual Property Office, the disclosure of which is incorporated herein in its entirety by reference.

BACKGROUND OF THE INVENTION

1. Field of the Invention

The present general inventive concept relates to a method of forming a thick layer more uniformly by screen printing, and a method of forming a piezoelectric actuator of an inkjet head using the method of forming the thick layer.

2. Description of the Related Art

Inkjet heads are devices for printing an image on a printing medium by ejecting ink droplets onto a desired region of the printing medium. Depending on an ink ejecting method, the inkjet heads can be classified into two types: thermal inkjet heads and piezoelectric inkjet heads. A thermal inkjet head generates bubbles in an ink to be ejected by using heat and ejects the ink utilizing an expansion of the bubbles, and a piezoelectric inkjet head ejects an ink using a pressure generated by deforming a piezoelectric material.

FIG. 1A is a sectional view illustrating a conventional piezoelectric inkjet head, and FIG. 1B illustrates a sectional view taken along line A-A' of FIG. 1A. The conventional piezoelectric inkjet head illustrated in FIGS. 1A and 1B is formed by a conventional screen printing method.

Referring to FIGS. 1A and 1B, a manifold 11, a plurality of restrictors 12, and a plurality of pressure chambers 13 forming an ink flow channel are formed in a flow channel plate 10 of the conventional piezoelectric inkjet head. A vibration plate 20, which can be deformed by piezoelectric actuators 40, is bonded to a top surface of the flow channel plate 10, and a nozzle plate 30 in which a plurality of nozzles 31 are formed is bonded to a bottom surface of the flow channel plate 10. The vibration plate 20 can be formed integrally with the flow channel plate 10, and the nozzle plate 30 can also be formed integrally with the flow channel plate 10.

The manifold 11 is an ink passage for supplying ink from an ink reservoir (not illustrated) to the respective pressure chambers 13, and the restrictors 12 are ink passages allowing inflow of ink from the manifold 11 to the pressure chambers 13. The pressure chambers 13 are filled with and eject the supplied ink and are arranged at one side or both sides of the manifold 11. The nozzles 31 are formed through the nozzle plate 30 and are connected to the respective pressure chambers 13. The vibration plate 20 is bonded to the top surface of the flow channel plate 10 to cover the pressure chambers 13. The vibration plate 20 is deformed by the operation of the piezoelectric actuators 40. Thus, pressures in the respective pressure chambers 13 change and the ink is ejected from the pressure chambers 13 by the operation of the piezoelectric actuators 40. Each of the piezoelectric actuators 40 includes a lower electrode 41, a piezoelectric layer 42, and an upper electrode 43 that are sequentially stacked on the vibration plate 20. The lower electrode 41 is formed on the entire surface of the vibration plate 20 as a common electrode. The piezoelectric layer 42 is formed on the lower electrode 41 above each of the pressure chambers 13. The upper electrode 43 is formed on the piezoelectric layer 42 as a driving electrode for applying a voltage to the piezoelectric layer 42.

In the conventional piezoelectric inkjet head, the piezoelectric actuator 40 is usually formed as follows. The lower electrode 41 is formed by sputtering a metal to a predetermined thickness on a top surface of the vibration plate 20. The piezoelectric layer 42 is formed by applying a piezoelectric ceramic material paste to a predetermined thickness to a top surface of the lower electrode 41 through screen printing, and by sintering the applied piezoelectric ceramic material paste. The upper electrode 43 is formed by applying a conductive material to a top surface of the piezoelectric layer 42 by screen printing and sintering the applied conductive material.

When forming the piezoelectric layer 42, the piezoelectric ceramic material paste is applied to the lower electrode 41 to a thickness of several tens of micrometers, and then the piezoelectric ceramic material paste is dried and sintered to obtain a thick layer for the piezoelectric layer 42. However, since the piezoelectric ceramic material paste applied to the lower electrode 41 is thick, the piezoelectric ceramic material paste spreads outward with time. This makes the piezoelectric layer 42 relatively thicker at a center portion and thinner at edge portions as illustrated in FIG. 1B, such that a thickness and a width of the piezoelectric layer 42 are not uniform. Further, an outer edge of the piezoelectric layer 42 can be curved although a straight outer edge is preferable. Accordingly, the overall shape of the piezoelectric layer 42 can be irregularly curved.

Furthermore, due to the unevenness of the piezoelectric layer 42, the thickness and the width of the upper electrode 43 formed on the piezoelectric layer 42 may not be uniform. In addition, the distance between the lower electrode 41 and the upper electrode 43 is not constant because of the uneven thickness of the piezoelectric layer 42, and thus an electric field cannot be uniformly formed between the lower electrode 41 and the upper electrode 43.

Additionally, nozzle density should be high to realize high-quality printing such as high-resolution and high-speed printing. The nozzle density is usually denoted using "cpi (channel per inch)," and the resolution of an image is usually denoted using "dpi (dot per inch)." To increase the nozzle density, the distance between adjacent pressure chambers 13 should be reduced. Accordingly, the distance between adjacent piezoelectric layers 42 should be reduced. However, as described above, since the piezoelectric layer 42 formed by a conventional method has an uneven width, the piezoelectric layer 42 may easily make contact with an adjacent piezoelectric layer 42 when they are formed closer to each other, making it difficult to increase the nozzle density much more.

As mentioned above, in the conventional method of forming a thick layer by screen printing, the thickness and width of the piezoelectric layer 42 of the piezoelectric actuator 40 cannot be uniformly formed. Further, the conventional method makes it difficult to increase the nozzle density of the inkjet head.

SUMMARY OF THE INVENTION

The present general inventive concept provides a method of forming a thick layer by screen printing and a method of forming a piezoelectric actuator of an inkjet head using the method of forming the thick layer. The method allows a piezoelectric layer to have a uniform width and thickness, and also allows the nozzle density of the inkjet head to be increased.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of forming a thick layer on a surface by screen printing, the method including forming a guide groove in the surface to a predetermined depth, and applying a paste material inside the guide groove formed on the surface through screen printing.

The guide groove may have the same contour as a desired contour of the thick layer.

A width of the material applied to the inside of the guide groove may be smaller than the width of the guide groove such that, the paste material is allowed to spread laterally inside the guide groove and the paste material has a width corresponding to the width of the guide groove and a uniform thickness.

The amount of the paste material applied to the inside of the guide groove may be such that a thick layer of the paste material has a uniform thickness.

A thick layer formed of the paste material may have a thickness of about several tens of micrometers.

The foregoing and/or other aspects and utilities of the present general inventive concept may also be achieved by providing a method of forming a piezoelectric actuator on a vibration plate of an inkjet head, the method including forming an insulating layer on a top surface of the vibration plate, forming a guide groove at a top surface of the vibration plate or the insulating layer to a predetermined depth at a position corresponding to a pressure chamber of the inkjet head, forming a lower electrode on the top surface of the insulating layer, applying a piezoelectric material to a top surface of the lower electrode inside the guide groove by screen printing to form a piezoelectric layer, and forming an upper electrode on a top surface of the piezoelectric layer.

The piezoelectric material may be a paste.

The guide groove may be formed at the top surface of the vibration plate, and then the insulating layer may be formed on the top surface of the vibration plate.

The insulating layer may be formed on the top surface of the vibration plate, and then the guide groove may be formed at the top surface of the insulating layer.

The insulating layer may be a silicon oxide layer.

The forming of the lower electrode may include depositing a conductive metal on the top surface of the insulating layer to a predetermined thickness.

The forming of the lower electrode may include sequentially depositing a Ti later and a Pt layer through sputtering.

The guide groove may have the same contour as a desired contour of the piezoelectric layer.

The forming of the guide groove may include forming a guide groove having a same contour as a desired contour of the piezoelectric layer after the lower electrode is formed at the top surface of the insulating layer.

The guide groove may have a width corresponding to the width of the pressure chamber.

The applying of the piezoelectric material may include applying the piezoelectric material paste inside the guide groove in such a manner that the width of the piezoelectric material paste applied is smaller than the width of the guide groove.

The applying of the piezoelectric material paste may further include allowing the piezoelectric material paste applied inside the guide groove to spread laterally to have a width corresponding to the width of the guide groove.

The applying of the piezoelectric material paste may further include allowing the piezoelectric material paste applied inside the guide groove to spread laterally to have a uniform thickness, a uniform width, and a straightened vertical outer edge.

The forming of the upper electrode may include applying an electrode material paste to the top surface of the piezoelectric layer by screen printing.

The method may also include sintering the piezoelectric layer and the upper electrode.

The forming of the upper electrode may include depositing a conductive metal on the top surface of the piezoelectric layer to a predetermined thickness by sputtering.

The method may also include sintering the piezoelectric layer prior to the forming of the upper electrode.

The foregoing and/or other aspects and utilities of the present general inventive concept may also be achieved by providing a method of forming a piezoelectric actuator, the method including forming guide grooves at a first surface of a vibration plate, forming a lower electrode along the first surface of the vibration plate, including the guide grooves, applying a piezoelectric material to the lower electrode at the guide grooves, and forming an upper electrode over the piezoelectric material.

The piezoelectric material may be a paste.

The applying of the piezoelectric material may include spreading the piezoelectric material along an entire surface of the guide groove.

The applying of the piezoelectric material may include screen printing the piezoelectric material to form a piezoelectric layer.

The method may further include forming an insulating layer over the first surface of the vibration plate before forming the lower electrode along the first surface of the vibration plate.

The forming of the guide grooves at a first surface of the vibration plate may include forming of guide grooves at a surface of the insulating layer, and the forming of the lower electrode along the first surface of the vibration plate, including the guide grooves may include forming a lower electrode along a top surface of the insulating layer, including the guide grooves.

The foregoing and/or other aspects and utilities of the present general inventive concept may also be achieved by providing a piezoelectric inkjet head including a flow channel plate having a plurality of pressure chambers, a vibration plate bonded to a top surface of the flow channel plate to cover the pressure chambers, an insulating layer formed on a top surface of the vibration plate, a nozzle plate having a plurality of nozzles corresponding to the pressure chambers, bonded to a bottom surface of the flow channel plate, and a plurality of piezoelectric actuators bonded to a top surface of the insulating layer to provide ink-ejecting forces to the respective pressure chambers by deforming the vibration plate, wherein a top surface of the insulating layer or a top surface of the vibration plate has a plurality of guide grooves of a predetermined depth and width, and the plurality of guide grooves are disposed in positions corresponding to the plurality of pressure chambers.

The top surface of the vibration plate may have the plurality of guide grooves.

The top surface of the insulating layer vibration plate may have the plurality of guide grooves.

The plurality of piezoelectric actuators may include a lower electrode formed on a top surface of the insulating layer as a common electrode, a plurality of piezoelectric layers formed inside each of the plurality of guide grooves on a top surface of the lower electrode, and a plurality of upper electrodes, each formed on a top surface of the plurality of piezoelectric layers as driving electrodes.

The piezoelectric layer may have a uniform width, a uniform thickness, and a straightened vertical outer edge.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
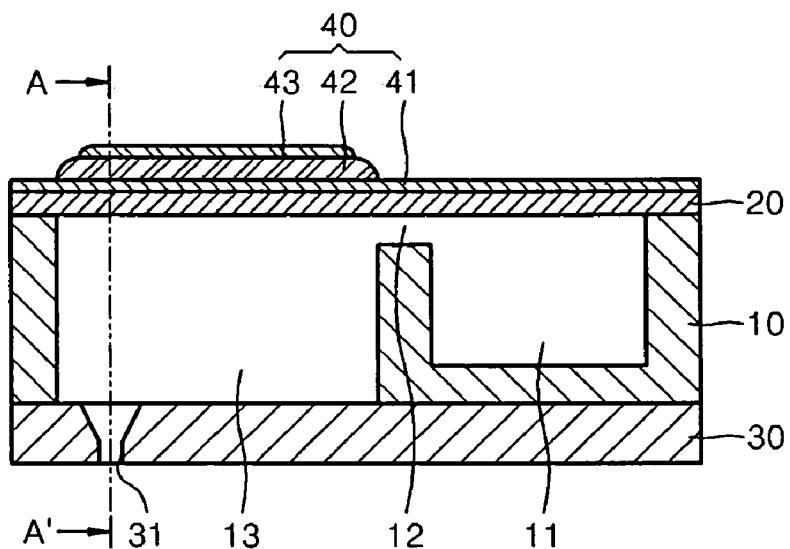
FIG. 1A is a sectional view illustrating a conventional piezoelectric inkjet head.
Figure 1B:
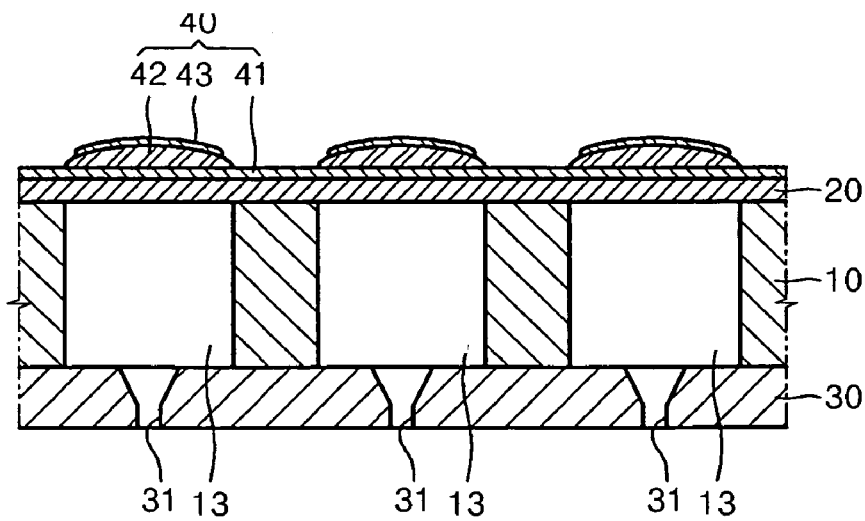
FIG. 1B illustrates a sectional view taken along line A-A' of FIG. 1A.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIGS. 2A through 2E illustrate a method of forming a piezoelectric actuator of an inkjet head using a method of forming a thick layer by screen printing according to an embodiment of the present general inventive concept.

Figure 2A:
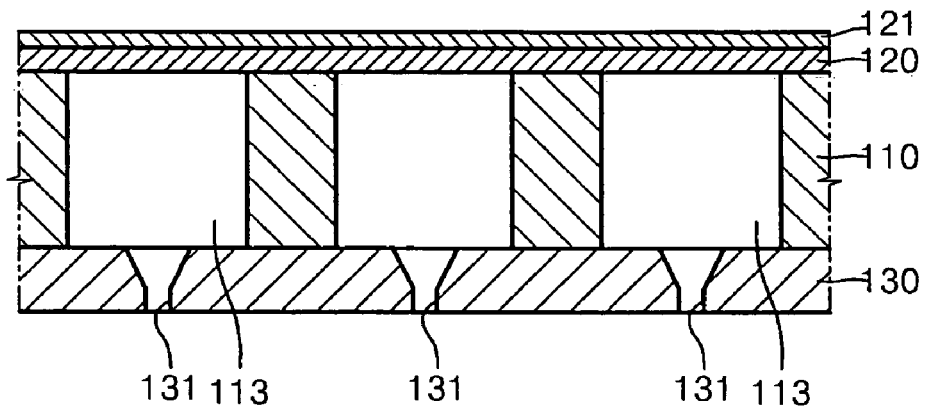
FIGS. 2A through 2E illustrate a method of forming a piezoelectric actuator of an inkjet head using a method of forming a thick layer by screen printing according to an embodiment of the present general inventive concept.

Referring to FIG. 2A, the piezoelectric inkjet head may include a plurality of plates forming an ink flow channel. For example, three plates may be used: a flow channel plate 110, a vibration plate 120, and a nozzle plate 130. A manifold (not illustrated), a plurality of restrictors (not illustrated), and a plurality of pressure chambers 113 may be formed in the flow channel plate 110, and the vibration plate 120 may be bonded to a top surface of the flow channel plate 110 to cover the pressure chambers 113. The nozzle plate 130 may be bonded to a bottom surface of the flow channel plate 110. A plurality of nozzles 131 are formed through the nozzle plate 130 corresponding to the pressure chambers 113. The flow channel plate 110 may be formed with a manifold (not illustrated) and a plurality of restrictors (not illustrated). Meanwhile, the vibration plate 120 can be formed integrally with the flow channel plate 110, and the nozzle plate 130 can also be formed integrally with the flow channel plate 110.

Figure 2B:
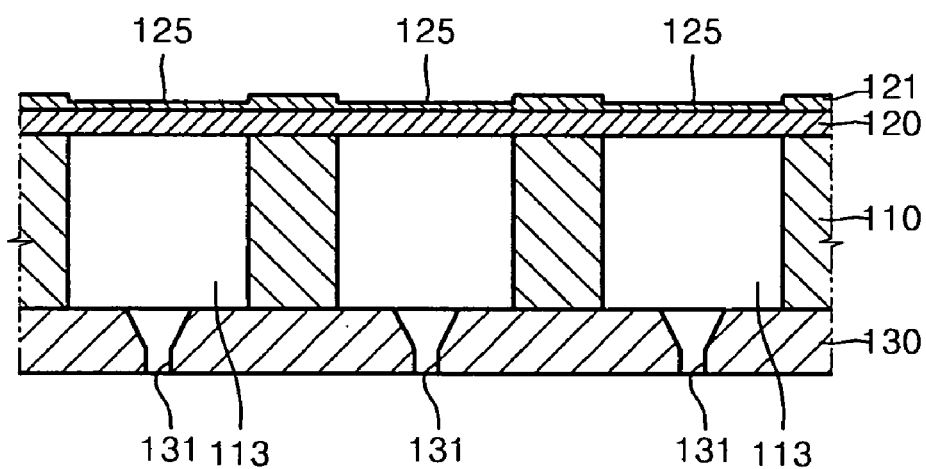
Figure 2C:
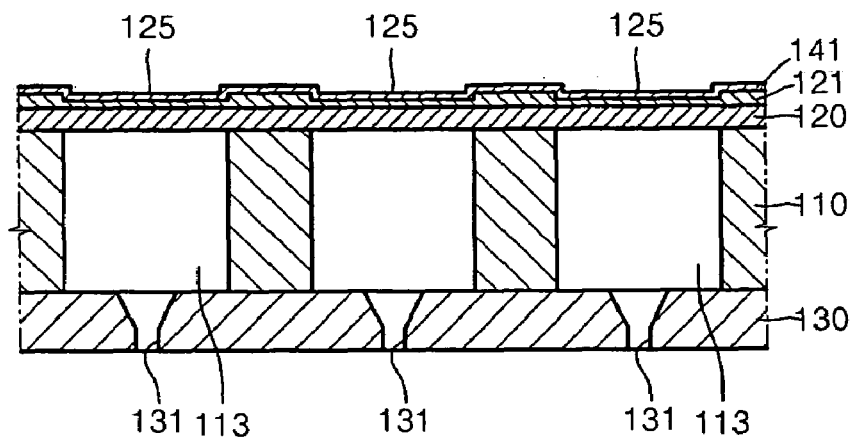
Figure 2D:
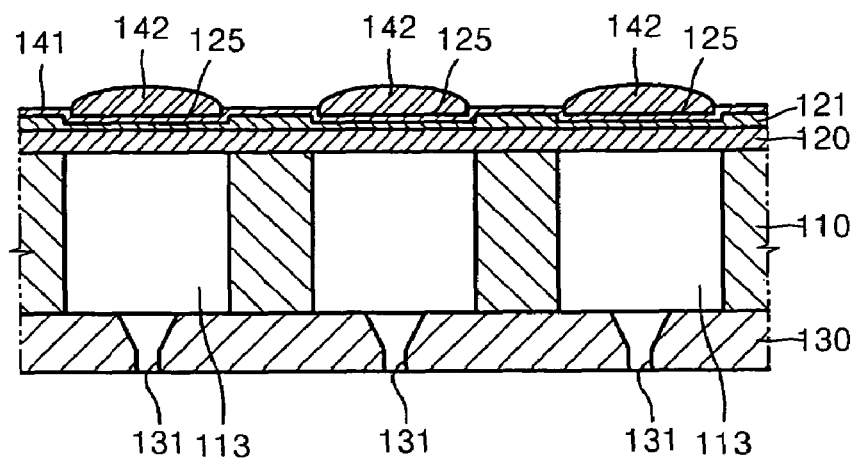
Figure 2E:
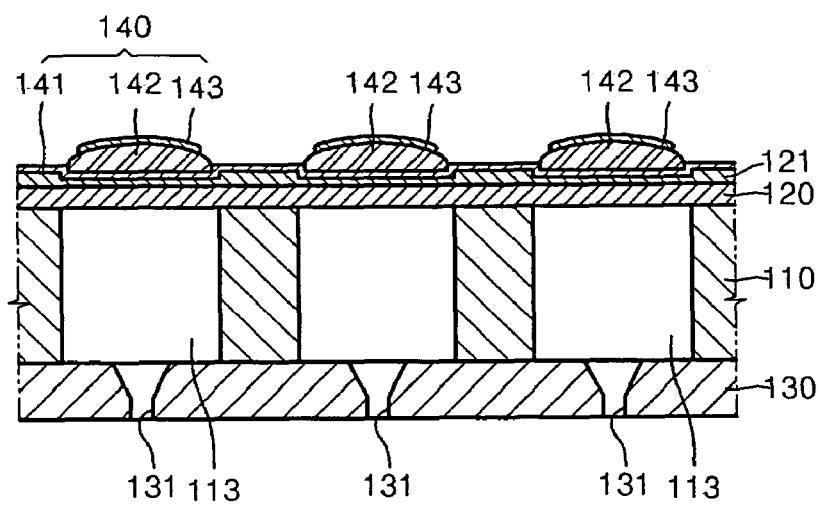

A plurality of piezoelectric actuators 140 provide ink-ejecting forces to the respective pressure chambers 113 by deforming the vibration plate 120 (refer to FIG. 2E). The plurality of piezoelectric actuators 140 can be formed on the vibration plate 120 through the following operations.

Referring again to FIG. 2A, an insulating layer 121 is formed on the entire top surface of the vibration plate 120. The insulating layer 121 can have a thickness of about 1 μm to about 2 μm. When the vibration plate 120 is formed of silicon, the insulating layer 121 may be formed of a silicon oxide.

Referring to FIG. 2B, a plurality of guide grooves 125 are formed in a top surface of the insulating layer 121 to a predetermined depth. The guide grooves 125 may be formed by partially removing the insulating layer 121 through a removal method such as etching, using a patterned photoresist as an etch mask. For example, when the insulating layer 121 has a thickness of about 1 μm to about 2 μm as described above, the guide grooves 125 can have a depth approximately equal to half the thickness of the insulation layer 121 (i.e., about 0.5 μm to about 1 μm). The guide grooves 125 are formed in the insulating layer 121 at locations corresponding to the respective pressure chambers 113. The guide grooves 125 may be formed to have the same contour as a desired contour of the piezoelectric layers 142 (refer to FIG. 2D) of the piezoelectric actuators 140, or may be formed to have the same contour as a desired contour of the piezoelectric layer 142 taking into consideration the formation of the lower electrode 141, as described below. The width of the guide grooves 125 may be substantially the same as that of the pressure chambers 113.

Referring to FIG. 2C, the lower electrode 141 is formed on the insulating layer 121 as a common electrode. The lower electrode 141 may be formed by depositing a conductive metal on an entire top surface of the insulating layer 121 to a predetermined thickness. Although the lower electrode 141 can be formed of a single metal layer, the lower electrode 141 may also be formed of two metal layers such as Ti and Pt layers. For example, the Ti metal layer can be formed to a thickness of about 400 Å by sputtering, and the Pt metal layer can be formed to a thickness of about 5000 Å by sputtering.

Referring to FIG. 2D, the piezoelectric layers 142 are formed on the lower electrode 141 inside the guide grooves 125. In detail, a piezoelectric material paste, such as a lead zirconate titanate (PZT) ceramic material paste, may be applied to the lower electrode to a predetermined thickness (e.g., about 30 μm to about 60 μm) by screen printing. While a piezoelectric material paste may be used, the current present general inventive concept is not limited thereto, and other forms of piezoelectric material may be used which result in the intended general inventive concept. The piezoelectric material paste may be applied in such a manner that a width of the piezoelectric layers 142 is slightly smaller than that of the guide grooves 125. Since the applied piezoelectric material paste may laterally spread with time, the piezoelectric layers 142 are leveled and widened into a more uniform shape as illustrated in FIG. 2D. The width of the piezoelectric layers 142 is restricted by the width of the grooves 125, such that the width of the piezoelectric layers 142 can be uniform. Further, a thickness of the piezoelectric layers 142 can be relatively uniform when compared with the related art. The piezoelectric layers 142 may be dried naturally or dried forcibly by using a hot plate heated up to about 100° C. Other suitable drying methods can be selected depending on characteristics of the piezoelectric material paste applied, such as a viscosity of the piezoelectric material paste.

Referring to FIG. 2E, upper electrodes 143 are formed on the respective piezoelectric layers 142 as driving electrodes. The upper electrodes 143 may be formed by applying an electrode material, paste, such as an Ag—Pd paste, to top surfaces of the piezoelectric layers 142 by screen printing and drying the applied electrode material paste. Then, the piezoelectric layers 142 and the upper electrodes 143 may be sintered at a temperature of about 900° C.~1200° C. After that, the piezoelectric layers 142 may shrink to a thickness of about 10 μm to about 30 μm.

As illustrated in FIG. 2E, after the above-described operations the piezoelectric actuators 140 can have a sequentially stacked structure formed by the lower electrode 141, the piezoelectric layers 142, and the upper electrodes 143. The piezoelectric layers 142 of the piezoelectric actuators 140 can have a relatively uniform width and thickness, and outer vertical edges of the piezoelectric actuators can be straightened owing to the guide grooves 125.

While the upper electrodes 143 can be formed by screen printing as described above, the present general inventive concept is not limited thereto and the upper electrodes 143 can also be formed by sputtering. For example, the piezoelectric layers 142 may be sintered before the upper electrode layers 143 are formed. Then, an electrode material, such as a conductive metal like Au or Pt, is deposited on the piezoelectric layers 142 to a predetermined thickness by sputtering, thereby forming the upper electrodes 143 as illustrated in FIG. 2E.

Figure 3A:
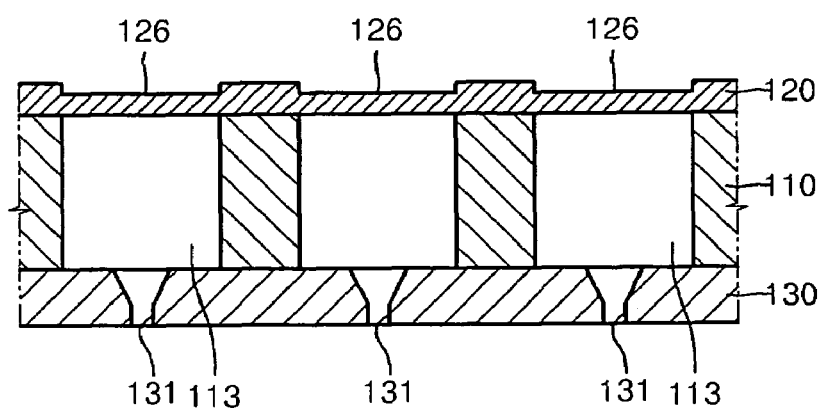
FIGS. 3A through 3C illustrate a method of forming a piezoelectric actuator of an inkjet head using a method of forming a thick layer by screen printing according to another embodiment of the present general inventive concept.
Figure 3B:
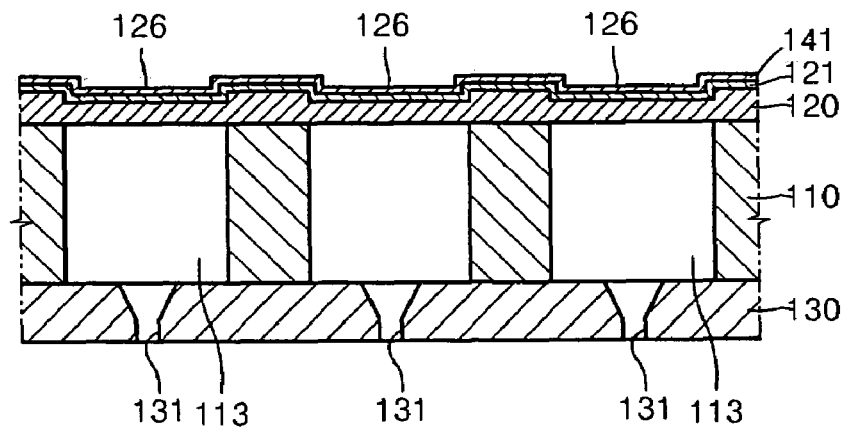
Figure 3C:
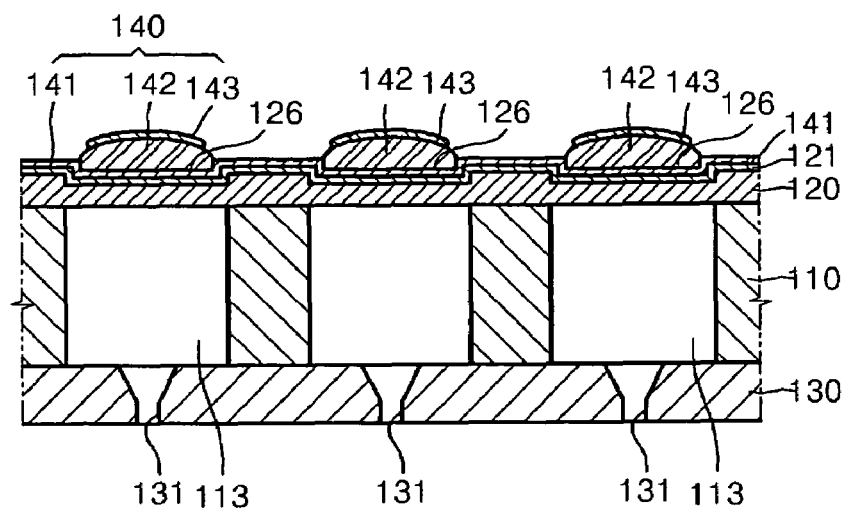

FIGS. 3A through 3C illustrate a method of forming a piezoelectric actuator of an inkjet head using a method of forming a thick layer by screen printing according to another embodiment of the present general inventive concept. The method illustrated in FIGS. 3A through 3C is similar to the method illustrated in FIGS. 2A through 2E, except that guide grooves are formed in a top surface of a vibration plate. Thus, the current embodiment will now be described briefly referencing similar processes illustrated in FIGS. 2A through 2E.

Referring to FIG. 3A, a plurality of guide grooves 126 are formed in a top surface of the vibration plate 120 to a predetermined depth. The guide grooves 126 may be formed by partially removing the top surface of the vibration plate 120 through a removal method, such as etching, using a patterned photoresist as an etch mask. Since the vibration plate 120 may have a thickness of about 10 μm to about 20 μm, depending on the size of pressure chambers 113, the vibration plate 120 is not affected by the guide grooves 126 when a depth thereof is about 0.5 μm about 1 μm. The guide grooves 126 are formed in the vibration plate 120 at locations corresponding to the respective pressure chambers 113. The guide grooves 126 may be formed to have the same contour as a desired contour of the piezoelectric layers 142 (refer to FIG. 3C) of the piezoelectric actuators 140 or may be formed to have the same contour as a desired contour of the piezoelectric layer 142 taking into consideration the formation of an insulating layer 121 and a lower electrode 141, as described below. The width of the guide grooves 126 may be substantially the same as that of the pressure chambers 113.

Referring to FIG. 3B, an insulating layer 121 and a lower electrode 141 are sequentially formed on the entire top surface of the vibration plate 120. The insulating layer 121 and the lower electrode 141 are formed in the same way as for the embodiment illustrated in FIGS. 2A through 2E.

Referring to FIG. 3C, piezoelectric layers 142 are formed on the lower electrode 141 inside the guide grooves 126 by screen printing, and upper electrodes 143 are formed on the piezoelectric layers 142 by screen printing or sputtering. The piezoelectric layers 142 and the upper electrodes 143 are formed in the same way as in the embodiment illustrated in FIGS. 2A through 2E.

As illustrated in FIG. 3C, after the above-described operations, the complete piezoelectric actuators 140 can have a sequentially stacked structure formed by the lower electrode 141, the piezoelectric layers 142, and the upper electrodes 143.

According to the present general inventive concept, a piezoelectric layer of a piezoelectric actuator can be uniformly formed and a more uniform electric field can be formed between the lower electrode and the upper electrode since the distance between the lower electrode and the upper electrode is more uniform. Further, the width of the piezoelectric layer can be uniformly controlled, so that the nozzle density of the inkjet head can be easily increased.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A piezoelectric inkjet head comprising:
 a flow channel plate having a plurality of pressure chambers;
 a vibration plate bonded to a top surface of the flow channel plate to cover the pressure chambers;
 an insulating layer formed on a top surface of the vibration plate;
 a nozzle plate having a plurality of nozzles corresponding to the pressure chambers, bonded to a bottom surface of the flow channel plate; and
 a plurality of piezoelectric actuators bonded to a top surface of the insulating layer to provide ink-ejecting forces to the respective pressure chambers by deforming the vibration plate;
 wherein a top surface of the insulating layer or a top surface of the vibration plate has a plurality of guide grooves of a predetermined depth and width, and the plurality of guide grooves are disposed in positions corresponding to the plurality of pressure chambers and the plurality of piezoelectric actuators formed inside each of the plurality of guide grooves.

2. The piezoelectric inkjet head of claim 1, wherein the top surface of the vibration plate has the plurality of guide grooves.

3. The piezoelectric inkjet head of claim 1, wherein the plurality of piezoelectric actuators comprise:
 a lower electrode formed on a top surface of the insulating layer as a common electrode;
 a plurality of piezoelectric layers formed inside each of the plurality of guide grooves on a top surface of the lower electrode; and
 a plurality of upper electrodes, each formed on a top surface of the plurality of piezoelectric layers as driving electrodes.

4. The piezoelectric ink head of claim 3, wherein the piezoelectric layer has a uniform width, a uniform thickness, and a straightened vertical outer edge.

5. A piezoelectric actuator unit of an inkjet head having a flow channel plate with a plurality of pressure chambers, a vibration plate having an insulating layer formed thereon to cover the plurality of pressure chambers, and a plurality of nozzles corresponding to the pressure chambers, the piezoelectric actuator unit comprising:
 a plurality of piezoelectric actuators disposed on a top surface of the insulating layer to provide ink-ejecting forces to corresponding pressure chambers by deforming the vibration plate,
 wherein at least one of the insulating layer and the vibration plate includes a plurality of guide grooves which correspond to the plurality of pressure chambers, and
 wherein the plurality of piezoelectric actuators are formed inside each of the plurality of guide grooves.

* * * * *